United States Patent
Takagi et al.

Patent Number: 6,160,339
Date of Patent: Dec. 12, 2000

[54] TWO-PORT SAW RESONATOR

[75] Inventors: Michiaki Takagi, Zatuno-machi; Takashi Yamazaki, Minowa-machi, both of Japan

[73] Assignee: Seiko Epson Corporation, Tokyo, Japan

[21] Appl. No.: 09/254,405

[22] PCT Filed: Apr. 3, 1998

[86] PCT No.: PCT/JP98/01569

§ 371 Date: Jul. 7, 1999

§ 102(e) Date: Jul. 7, 1999

[30] Foreign Application Priority Data

Jul. 17, 1997 [JP] Japan .................................. 9-192673

[51] Int. Cl.[7] .................................................. H01L 41/08
[52] U.S. Cl. .................................. 310/313 D; 310/313 B
[58] Field of Search ........................... 310/313 A, 313 R, 310/313 D, 313 B; 333/193–196

[56] References Cited

U.S. PATENT DOCUMENTS

| | | | |
|---|---|---|---|
| 3,886,504 | 5/1975 | Hartmann et al. | 310/313 B |
| 4,731,595 | 3/1988 | Wright | 310/313 D |
| 5,485,052 | 1/1996 | Seki et al. | 310/313 D |
| 5,568,002 | 10/1996 | Kawakatsu et al. | 310/313 B |
| 5,717,367 | 2/1998 | Murai | 333/195 |
| 5,731,748 | 3/1998 | Tada | 333/193 |
| 5,835,990 | 11/1998 | Saw et al. | 310/313 D |
| 5,874,868 | 2/1999 | Shimoe | 310/313 D X |
| 5,874,869 | 2/1999 | Ueda et al. | 310/313 D |
| 5,966,061 | 10/1999 | Tada | 333/195 |

FOREIGN PATENT DOCUMENTS

| | | |
|---|---|---|
| 61-230419 | 10/1986 | Japan . |
| 61-251223 | 11/1986 | Japan . |
| 64-19815 | 1/1989 | Japan . |
| 1-231417 | 9/1989 | Japan . |
| 2-96414 | 4/1990 | Japan . |
| 4-259109 | 9/1992 | Japan . |
| 4-265009 | 9/1992 | Japan . |
| 5-160665 | 6/1993 | Japan . |
| 5-251988 | 9/1993 | Japan . |
| 5-267990 | 10/1993 | Japan . |
| 5-335881 | 12/1993 | Japan . |
| 6-37583 | 2/1994 | Japan . |
| 7-122964 | 5/1995 | Japan . |
| 8-288782 | 11/1996 | Japan . |

OTHER PUBLICATIONS

Suzuki, Y., et al. "Energy–Trapping Surface Acoustic Wave Resonators", Institute of Electronics, Information and Communication Engineers Technical Report IEICE, Japan, US87–36 (Sep. 1987), pp. 9–16.

Wright, P. V., et al. "A Review of Saw Resonator Filter Technology", 1992 Ultrasonics Symposium, IEEE (1992), pp. 29–39.

*Primary Examiner*—Mark O. Budd
*Attorney, Agent, or Firm*—Oliff & Berridge, PLC

[57] ABSTRACT

To provide a two-port SAW resonator in which spurious responses causes by higher-order vertical inharmonic modes are suppressed, a pair of reflectors and three IDTs are provided on the surface of a piezoelectric plate. The frequency-increase rate of the second and third IDTs is set to be smaller than that of the first IDT so that the frequency-increase rate of the first IDT is 2000 to 12000 ppm. In addition, by setting the number of pairs of the electrodes of the second and third IDTs at 2.75 to 3.75 or a quarter of the number of pairs of the electrodes of all the IDTs, spurious responses caused by higher-order vertical inharmonic modes are suppressed, and equivalent series resistance is reduced to approximately 20Ω. Therefore, a two-port SAW resonator having a superior frequency stability in a high-frequency band of 500 MHz or higher is realized.

12 Claims, 14 Drawing Sheets

TWO-PORT SAW RESONATOR

BACKGROUND OF THE INVENTION

1. Field of the Invention

The present invention relates to two-port surface-acoustic-wave resonators (hereinafter referred to as "two-port SAW resonators"). In particular, it relates to a structural technology for suppressing spurious responses (unnecessary resonance) caused by higher-order vertical inharmonic modes in a two-port SAW resonator.

2. Description of Related Art

The basic electrode structure of a conventional two-port SAW resonator is disclosed in, e.g., U.S. Pat. No. 3,886,504, and a rotated Y-quartz plate in the case where an electrode film thickness is 1000 Å or less is disclosed in Japanese Unexamined Patent Publication No. 61-251223. In addition, in Japanese Unexamined Patent Publication No. 61-230419, an example with three interdigital transducers (hereinafter referred to as "IDTs") is described.

In a two-port SAW resonator having three interdigital transducers, the central interdigital transducer is used as an input terminal, and on both sides thereof, the other interdigital transducers are disposed. Accordingly, the frequency of the two-port SAW resonator is stable for a change in the load of the output load circuit. The use of this type causes a temperature coefficient to change to zero in a so-called ST-cut two-port SAW resonator formed on an ST-cut X-transmission plate composed of single crystals of quartz. This is superior in terms of frequency stability similarly to that of a one-port type.

According to the above-described conventional art, when, in an ST-cut two-port SAW resonator having three interdigital transducers, an electrode film thickness is set at 1000 Å or more so that the device size is reduced, resonance caused by a plurality of higher-order vertical inharmonic modes exists which is less than a main resonant frequency. There is a problem in that there is resonance caused by the plurality of higher-order vertical inharmonic modes, and a mode closest to the main resonant frequency causes a frequency jump to bring about inferior communication when the two-port SAW resonator is built into an oscillating circuit of a communication apparatus, because an oscillating-frequency-adjustment expansion coil allows frequencies to be close, whereby simultaneous excitation occurs.

In addition, despite the complete suppression of the higher-order vertical inharmonic modes, it is found that, when crossbus-bar conductors are disposed between the central interdigital transducer and the interdigital transducers on both sides thereof, two spurious responses having almost equivalent amplitudes are generated, depending on the crossbus-bar conductor structure.

SUMMARY OF THE INVENTION

Accordingly, the present invention is intended to solve the foregoing problems, and an object thereof is to provide to the communication market etc., a two-port SAW resonator having a superior frequency stability and no spurious responses.

The present invention is based on the premise that, in an SAW resonator, an IDT and reflectors disposed on both sides thereof are formed so as to confine the energy of surface acoustic waves. In addition, in an energy-confinement SAW resonator, in view of frequency potential, with an IDT divided into three, the central IDT activates surface acoustic waves, and the side IDTs receive the surface acoustic waves, whereby a displacement is controlled.

The present invention provides a two-port SAW resonator comprising: a first interdigital transducer for activating surface acoustic waves; one pair of second and third interdigital transducers for receiving the surface acoustic waves on both sides of the first interdigital transducer; and one pair of reflectors positioned on both sides of the second and third interdigital transducers, the first, second, and third interdigital transducers being cyclically formed on a piezoelectric plate using parallel metal conductors, wherein the distance between two parallel conductors, obtained when the reflectors are closest with respect to the second and third interdigital transducers, is a space among the lines and spaces of the interdigital transducers, the two-port SAW resonator characterized in that the cycle of the parallel conductors of the first interdigital transducer is set to be smaller than the cycle of the parallel conductors of the reflectors so that frequency increasing occurs, and the total reflection coefficient $\Gamma$ of the reflectors is set as $10 > \Gamma > 0.8$ so that energy confinement is established, and the cycle of the parallel conductors of the second and third interdigital transducers is set to be greater than the cycle of the parallel conductors of the first interdigital transducer so that frequency decreasing occurs.

According to the present invention, it is preferable that the number of pairs in the second and third interdigital transducers is in the range of 1/2.75 to 1/3.75 of the sum of the numbers of pairs in the first, second, and third interdigital transducers. In other words, in the case that the sum of pairs in the three IDTs changes, when the parallel conductors are divided into the three IDTs, it is preferable that the equivalent series resistance of the two-port SAW resonator is reduced by setting the divisor in the range of 1/2.75 to 1/3.75 of the sum of pairs in the first, second, and third interdigital transducers.

According to the present invention, it is preferable that the number of pairs in the second and third interdigital transducers is $1/(4\pm2\%)$ of the sum of the numbers of pairs in the first, second, and third interdigital transducers, namely, in the range of 1/3.92 to 1/4.08.

According to the present invention, it is preferable that the frequency increase of the first interdigital transducer is in the range of 2000 ppm to 12000 ppm. In other words, by setting the frequency increase of the interdigital transducers in the range of 2000 ppm to 12000 ppm, the set value is suitable for suppressing spurious responses. In particular, it is preferable that the frequency increase of the first interdigital transducer is in the range of 4000 ppm to 10000 ppm.

According to the present invention, it is preferable that the number of pairs in the first interdigital transducer is the range from 80 to 110. In other words, the energy can be confined in proportion to the number of pairs in the first interdigital transducer. However, when the number of pairs in the first interdigital transducer is too great, large vertical-mode spurious vibration is generated. Therefore, it is preferable to set the number of pairs in the first interdigital transducer in a proper range, e.g., the range of 80 to 110.

According to the present invention, the cycle of the parallel conductors of the second and third interdigital transducers is approximately equal to that of the reflectors.

According to the present invention, the electrode-film thickness of the first interdigital transducer is less than the film thickness of the second and third interdigital transducers.

According to the present invention, when the thickness of the first, second, and third interdigital transducers is represented by H, and the wavelength of the surface acoustic waves is represented by λ, the ratio H/λ between the film thickness H of the interdigital transducers and the wavelength λ of the surface acoustic waves is in the range of 0.013 to 0.03.

According to the present invention, in the case where the sum of the numbers of pairs in the first, second, and third interdigital transducers is, for example, in the range of 180 to 300, the equivalent series resistance can be reduced to a level at which no problem occurs in practice.

According to the present invention, it is preferable that the total length of the widths of crossbus-bar conductors formed between the first interdigital transducer and the second interdigital transducer and between the first interdigital transducer and the third interdigital transducer, and the widths of spaces on both sides of the widths of the crossbus-bar conductors is $n\lambda+(1/4)\lambda$, or $n\lambda+(3/4)\lambda(n=0, 1, 2, \ldots)$ where λ is the wavelength of the surface acoustic waves. When the total length of the widths of crossbus-bar conductors and the widths of spaces on both sides thereof is $n\lambda+(1/2)\lambda(n=0, 1, 2, \ldots)$, two resonant modes having almost equivalent amplitudes are activated, despite the fact that the higher-order vertical inharmonic modes are completely suppressed. Accordingly, when the total length of the widths of crossbus-bar conductors and the widths of spaces on both sides thereof is $n\lambda+(1/4)\lambda$, or $n\lambda+(3/4)\lambda$, a waveform having only one resonant mode is formed to avoid the phenomenon that the two resonant modes are activated. In other words, by properly setting the interval of the first interdigital transducer and the second interdigital transducer, and the interval of the first interdigital transducer and the third interdigital transducer, the activation of the two further resonant modes can be avoided.

According to the present invention, it is preferable that the piezoelectric plate is ST-cut or K-cut quartz. In this manner, in the case where the piezoelectric plate is ST-cut quartz, temperature characteristics can be improved. In the case where the piezoelectric plate is K-cut quartz, the temperature characteristics can be further improved. The K-cut means cutting so that a phase-transmission direction is formed in the direction of approximately 32.4 degrees from the X-axis in a rotated Y-cut plane having 6.5 degrees around the X-axis.

DETAILED DESCRIPTION OF PREFERRED EMBODIMENTS

A two-port SAW resonator of the present invention that uses surface acoustic waves such as Rayleigh waves, Leakey waves, and surface transversal waves (STW) will be described below.

In the following description, an aluminum wire or gold wire may be used as a conductor for electrically connecting second and third IDTs. When the IDTs are formed, it is preferable to form the conductor on a piezoelectric plate in view of cost and reliability. Accordingly, in the two-port SAW resonator described below, as a conductor crossing portion through which the surface acoustic waves are transmitted, a crossbus-bar conductor is formed, and it is connected by another conductor. Therefore, this conductor for connection is referred to as a "connection conductor" so as to be distinguished from the crossbus-bar conductor.

Overall Structure

Figure 1:
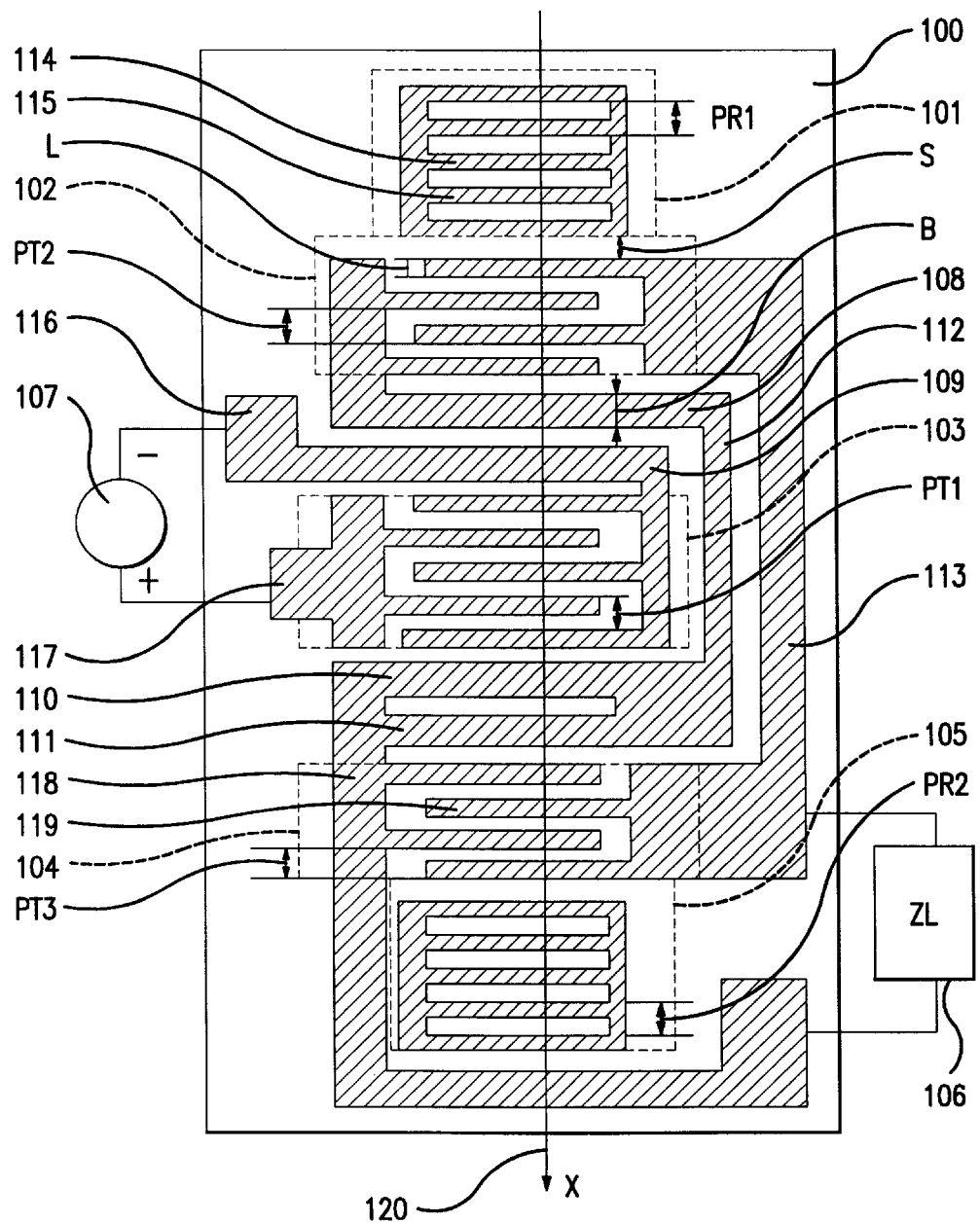
FIG. 1 is a plan view of a two-port SAW resonator to which the present invention is applied.

FIG. 1 is a plan view showing the electrode pattern of a two-port SAW resonator to which the present invention is applied.

In FIG. 1, a piezoelectric plate 100 is a device piece obtained by cutting a particular wafer cut from quartz into smaller pieces, such as an ST-X-transmission cut, an LST-X-transmission cut, or a K-cut (having a phase-transmission direction in the direction of approximately 32.4 degrees from the X-axis in a rotated Y-cut plane having 6.5 degrees around the X-axis).

On the piezoelectric plate 100, a first IDT 103 for activating surface acoustic waves, and a pair of second and third IDTs 102 and 104 for receiving the surface acoustic waves on both sides of the first IDT 103 are formed using cyclically formed metallic strip conductors (parallel conductors). In the first, second, and third IDTs 103, 102, and 104, a plurality of pairs of electrodes are formed. However, only two pairs are shown in FIG. 1.

In this embodiment, a first crossbus-bar conductor 108 and a second crossbus-bar conductor 109 are disposed between the first IDT 103 and the second IDT 102. A third crossbus-bar conductor 110 and a fourth crossbus-bar conductor 111 are disposed between the first IDT 103 and the third IDT 104.

The first IDT 103 is used as a device input terminal, and is connected to an electric AC signal source 107 by a conductor such as an aluminum wire. One pair of the second and third IDTs 102 and 104 on both sides of the first IDT 103 are connected by connection conductors 112 and 113, whereby one output IDT is formed by all of them. An electric load impedance ZL 106 is connected to the second and third IDTs 102 and 104.

On both sides of the first, second, and third IDTs 103, 102, and 104, a pair of first and second reflectors 101 and 105 are disposed.

In this two-port SAW resonator, the phase transmission direction of surface acoustic waves such as Rayleigh waves is represented by the X-axis 120.

The above-described conductor patterns, such as first, second, and third IDTs 103, 102, and 104; the first and second reflectors 101 and 105; the first, second, third and fourth crossbus-bar conductors 108, 109, 110, and 111; and the connection conductors 112 and 113, are obtained by using thin-film formation means such as vacuum deposition or sputtering to form on the piezoelectric plate 100 a film of conductor metal such as Al, Au, or Cu, and using photolithography techniques to pattern the formed film. Here, by using ion etching for patterning the thin film, fine patterns can be precisely formed.

In further detail, conductor strips 118 and 119 (parallel conductors) of the first, second, and third IDTs 103, 102, and 104, and conductor strips 114 and 115 of the first and second reflectors 101 and 105 (parallel conductors), are formed such that a plurality of slenderly rectangular conductor strips are disposed in parallel at cyclic intervals so as to be perpendicular to the phase transmission direction (represented by the X-axis 120) of surface acoustic waves.

As shown in FIG. 1, the cyclic interval of the conductor strips in the first reflector 101 is represented by PR1, the cyclic interval of the conductor strips in the second IDT 102 is represented by PT2, the cyclic interval of the conductor strips in the first IDT 103 is represented by PT1, the cyclic interval of the conductor strips in the third IDT 103 is represented by PT3, and the cyclic interval of the conductor strips in the second reflector 105 is represented by PR2. The cyclic interval PT2 of the conductor strips in the second IDT 102 is equal to the cyclic interval PT3 of the conductor strips in the third IDT 103. The cyclic interval PR1 of the conductor strips in the first reflector 101 is equal to the cyclic interval PR2 of the conductor strips in the second reflector 105.

Ordinarily, the X-axial width of a portion having conductor strips is called "line (L)", and the X-axial width of a portion without any conductor is called "space (S)". The above-described cyclic interval is the sum of the X-axial width (line: L) of the conductor strip, and the X-axial width (space: S) of the portion without any conductor.

The present invention as set forth is established regardless of whether or not crossbus-bar conductors are provided. An optimal structure in the case where crossbus-bar conductors are provided will be described below with reference to FIG. 13.

The two-port SAW resonator to which the present invention is applied operates as follows: An AC signal generated from the electric AC signal source 107 applies an alternate electric field across electrodes connected to the positive terminal 117 and negative terminal 116 of the first IDT 103, whereby alternately vibrating stress is generated on the piezoelectric plate 100. The alternate stress causes the surface acoustic waves to radiate in the positive and negative directions of the X-axis 120, and the radiated surface acoustic waves are reflected toward the center of the piezoelectric plate 100 by the plurality of conductor strips in the first and second reflectors 101 and 105. As a result, standing waves in accordance with the pitch of the first and second reflectors 101 and 105 are formed to generate an vibratory phenomenon. The second IDT 102 and the third IDT 104 detect vibratory charge generated by elastic vibration, and supply it to the load impedance ZL 106. In this manner, a two-port SAW resonator resonating in series at a frequency at which the vibratory phenomenon has a maximum amplitude is realized.

Energy Confinement in SAW Resonator

The two-port SAW resonator having the above-described structure is designed so that the IDTS, and the reflectors disposed on both sides thereof confine the energy of surface acoustic waves.

The concept of the energy-confinement type is described in "Energy-Confinement Surface-Acoustic-Wave Resonator" by Suzuki, Shimizu, and Yamanouchi, the Institute of Electronics, Information and Communication Engineers Technical Report IEICE, Japan, US87-36, pp. 9–16 (issued in September, 1987). This document describes energy confinement in a one-port SAW resonator.

It is empirically known that when the total reflection coefficient $\Gamma$ of the IDTs and the reflectors disposed on both sides thereof is defined by the following equation, by setting this value in the range of 0.8 to 10, an energy confinement type can be formed.

$$\Gamma = 4 \cdot M \cdot a \cdot H / \lambda \tag{1}$$

where M is the number of pairs in the IDTs, "a" is the reflection coefficient of surface acoustic waves per strip conductor, H is the film thickness of a strip conductor, and $\lambda$ is the wavelength of surface acoustic waves.

Figure 2:
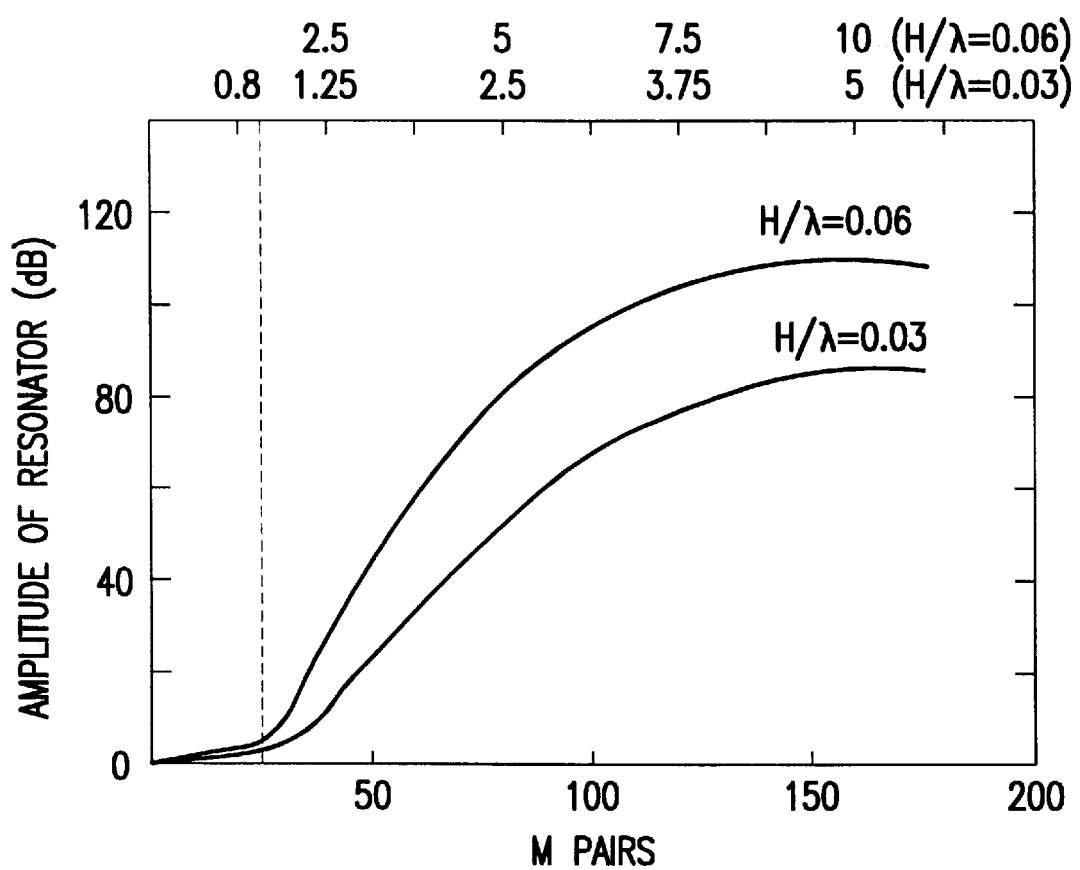
FIG. 2 is a graph illustrating conditions for confining energy in an SAW resonator.

For demonstrating the relationship between the total reflection coefficient $\Gamma$ and energy confinement, in FIG. 2, changes, in the resonant amplitude of a one-port SAW resonator obtained when the number M of pairs in the IDTs is used as a parameter to control the total reflection coefficient $\Gamma$, are shown. From FIG. 2, it is seen that the amplitude tends to rise when the total reflection coefficient $\Gamma$ is approximately 0.8, which shows usability as a resonator. However, when the ratio of the wavelength $\lambda$ of surface acoustic waves to the electrode film thickness H is increased, the amplitude gradually decreases after reaching its maximum, due to loss of conversion from surface acoustic waves to bulk waves, or the viscosity of an electrode material. In the example shown in FIG. 2, the amplitude decreases when the total reflection coefficient $\Gamma$ exceeds 10. Accordingly, the upper limit 10 of the total reflection coefficient $\Gamma$ corresponds to a boundary value showing that an equivalent series resistance R1 tends to increase. Therefore, by setting the total reflection coefficient $\Gamma$ in the range of approximately 0.8 to 10, an energy confinement type is realized.

The present invention develops the above-described concept to constitute an energy-confinement two-port SAW resonator, and is intended to improve a frequency stability and to suppress spurious responses in the two-port SAW resonator.

Frequency Potential

Figure 3:
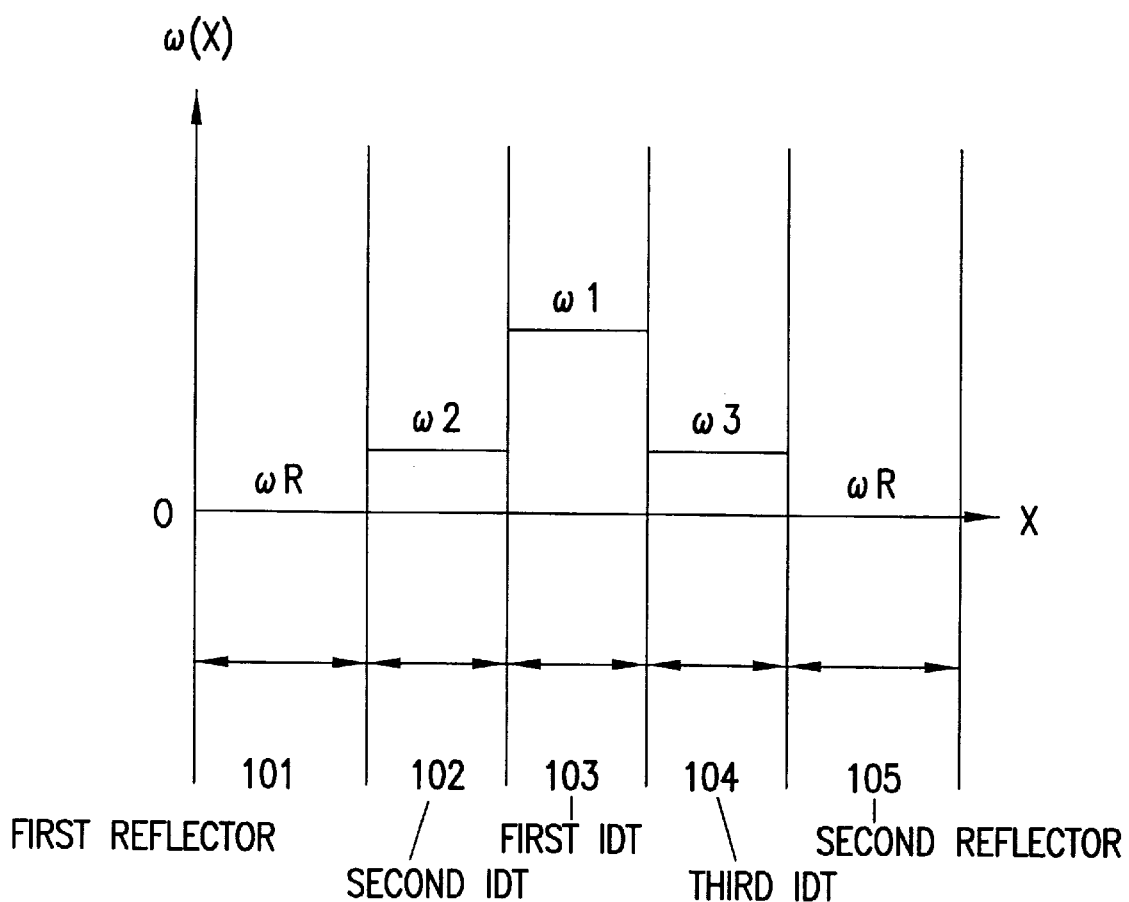
FIG. 3 is a graph showing constituent conditions of the two-port SAW resonator shown in FIG. 1.

FIG. 3 is a graph showing properties of the two-port SAW resonator shown in FIG. 1. The vertical axis in FIG. 3 represents the angular frequencies $\omega$ ($=2\pi f$) of the components (the first, second, and third IDTs 103, 102, and 104, and the first and second reflectors 101 and 105) of the two-port SAW resonator which are disposed in the direction of the X-axis 120 in FIG. 1.

When the sonic speed of surface acoustic waves to be used in a region is represented by V, and the cycle (also called "pitch") of a conductor strip constituting a component is represented by P, the angular frequency $\omega$ is obtained by dividing the sonic speed V by the conductor strip cycle P as shown by the following equation.

$$\omega=2\cdot\pi\cdot V/2\cdot P \quad (2)$$

The cycles of the components (the first, second, and third IDTs 103, 102, and 104, and the first and second reflectors 101 and 105) are PT1, PT2, PT3, PR1, and PR2, respectively, as described with reference to FIG. 1.

Angular frequency ωR shown in FIG. 3 is the angular frequency of the first and second reflectors 101 and 105, and angular frequencies ω1, ω2, and ω3 are the angular frequencies of the first, second, and third IDTs 103, 102, and 104, respectively. These angular frequencies are respectively expressed by the following equations:

$$\omega1=2\cdot\pi\cdot V/2\cdot PT1 \quad (3)$$

$$\omega2=2\cdot\pi\cdot V/2\cdot PT2 \quad (4)$$

$$\omega3=2\cdot\pi\cdot V/2\cdot PT3 \quad (5)$$

$$\omega R=2\cdot\pi\cdot V/2\cdot PR \quad (6)$$

where PR=PR1=PR2.

A feature of the present invention is that, by maximizing the angular frequency ω1 of the first IDT, the angular frequencies ω2 and ω3 of the second and third IDTs are set to be less than the angular frequency ω1.

In other words, ω1, ω2, ω3, and ωR satisfy the following numerical expression:

$$\omega1>\omega2=\omega3\geq\omega R \quad (7)$$

Accordingly, each cycle is set so as to satisfy $$PT1<PT2=PT3\leq PR \quad (8)$$

As a result, the strip conductor cycle PT1 of the first IDT 103 is set to be less than the strip conductor cycle PR (PR1, PR2) of the first and second reflector 101 and 105. In addition, the strip conductor cycles PT2 and PT3 of the second and third IDTs 102 and 104 are set to be greater than the strip conductor cycle PT1 of the first IDT 103.

In view of increasing the frequency of the first IDT 103, the strip conductors constituting the first IDT 103 may be formed to be thinner than the strip conductors constituting the second and third IDTs 102 and 104. In an etching process requiring such a high precision, it is preferable to employ ion etching.

It is in the case where the two-port SAW resonator has so-called energy-increasing wave-distributed characteristics in which aluminum electrodes are formed on an ST-X-cut or K-cut quartz that the setting of the angular frequencies shown in FIG. 3 is proper.

Therefore, in the case where gold electrodes are formed on a plate such as ST-X-cut or K-cut quartz, the two-port SAW resonator has frequency-decreasing wave-distributed characteristics. Thus, it is necessary to set the magnitudes of the angular frequencies shown in FIG. 3 in reverse.

Also, the above-described SAW-resonator frequency-increasing and frequency-decreasing types are described in the above document, "Energy-Confinement Surface-Acoustic-Wave Resonator", the Institute of Electronics, Information and Communication Engineers Technical Report IEICE, Japan, US87-36, pp. 9–16 (issued in September, 1987).

Relationship Between Number of Divided IDTs and Equivalent Series Resistance

Next, concerning how the suppression of the vertical inharmonic modes, which is an object of the present invention, is achieved by the present-invention arrangements shown in FIG. 1 and FIG. 3, by way of example, the case where Rayleigh waves are used for ST-cut quartz is described showing detailed conditions and graphs.

Figure 4:
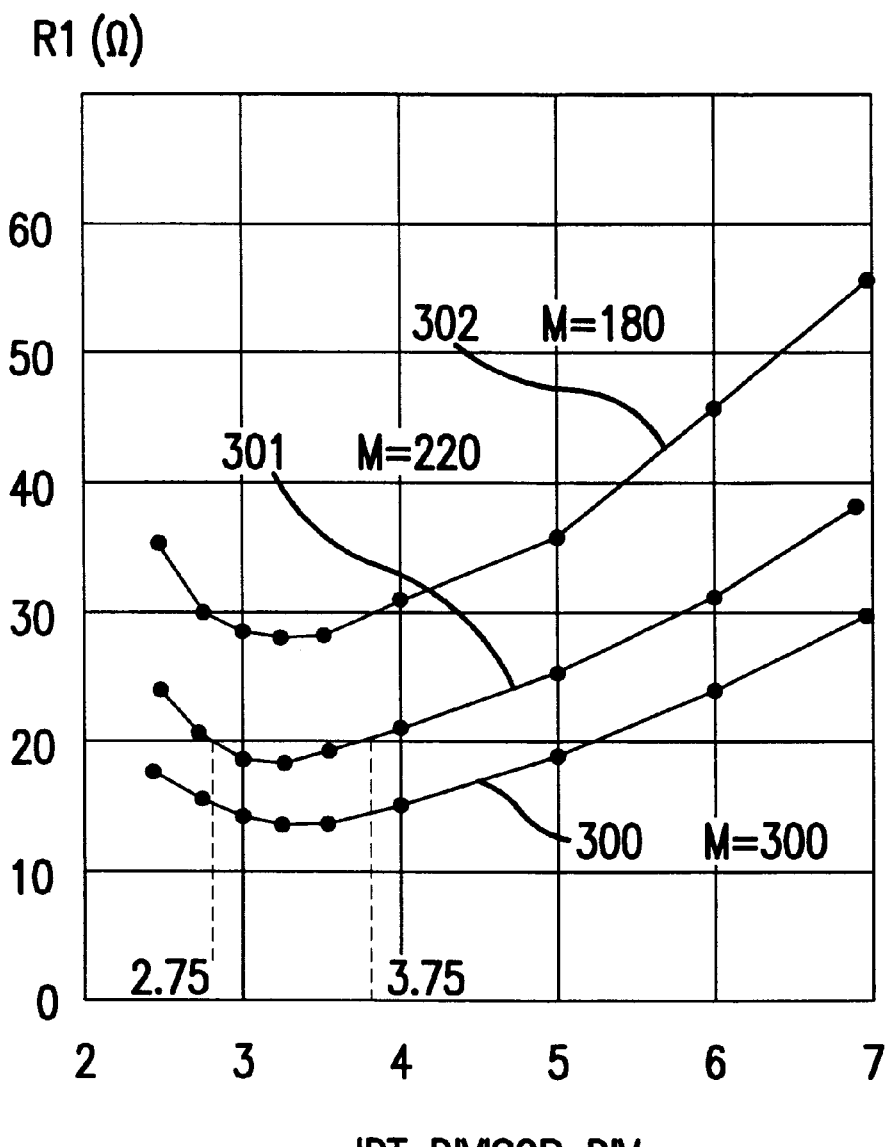
FIG. 4 is a graph showing the relationship between an IDT divisor and R1 in the two-port SAW resonator shown in FIG. 1.

FIG. 4 is a graph showing the relationship between the number of divided IDTs and R1 in the two-part SAW resonator shown in FIG. 1.

The analyses shown in FIG. 4 are for optimally setting pairs obtained when, in the electrode arrangement shown in FIG. 1, the number of positive and negative electrodes (such as 118 and 119 in FIG. 1) of the first IDT 103, the second IDT 102, or the third IDT 104 is set to one. In other words, FIG. 4 shows changes in the equivalent series resistance R1 of the two-port SAW resonator, obtained when the pair in each IDT is changed by dividing the sum M (=M1+M2+M3) of pairs of the first, second, and third IDTs 103, 102, and 104 by various divisors DIV where the numbers of pairs in the first, second, and third IDTs 103, 102, and 104 are represented by M1, M2 and M3, respectively. The number of pairs M2 in the second IDT 102 is set to be equal to the number of pairs M3 of the third IDT 104.

In FIG. 4, the curves 300, 301 and 302 show analyses obtained when the sum M of the numbers of pairs in the three IDTs is 300, 220 and 180, respectively.

As shown in FIG. 4, in the case where a change in the equivalent series resistance R1 is set to 10% or less (resistance change is not more than 2Ω), the range of the divisor DIV at which the equivalent series resistance R1 is minimum is shown as the divisor DIV=2.75 to 3.75. In other words, if the sum M of pairs in the three IDTs changes, the equivalent series resistance R1 of the two-port SAW resonator can be set at its minimum level by setting the divisor DIV in the range of 2.75 to 3.75.

In addition, in the analyses shown in FIG. 4, when the sum M of the number of pairs in the three IDTs is in the range of 180 to 300, the equivalent series resistance R1 can be reduced to a level at which no problem occurs in practice.

Number of Pairs in First IDT

Figure 5:
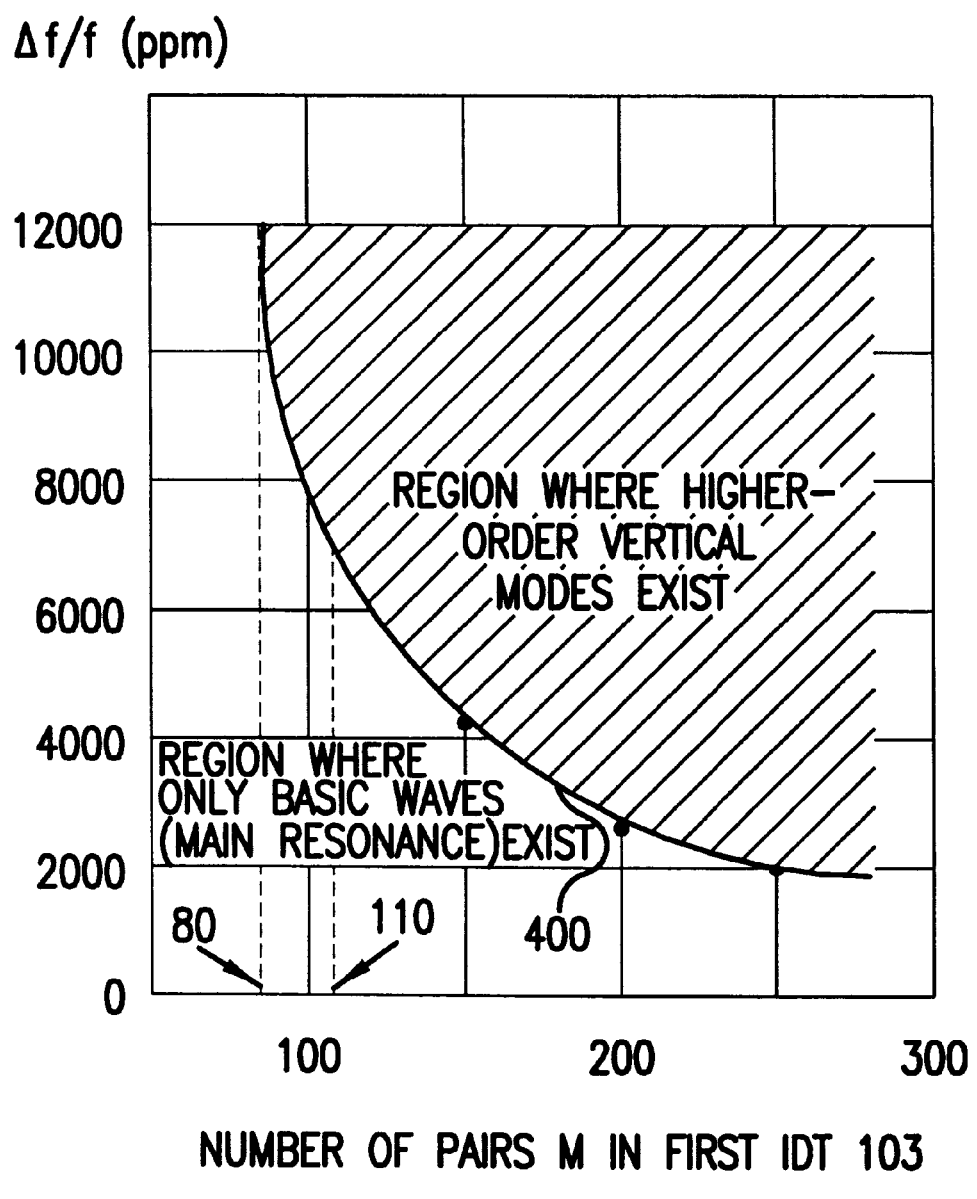
FIG. 5 is a graph showing a frequency increase of a first IDT in the two-port SAW resonator shown in FIG. 1.

FIG. 5 is a graph showing the case where higher-order vertical inharmonic modes are generated for a combination of the number of pairs M1 in the first IDT 103 positioned in the center=M and a frequency increase Δf/f (unit: ppm) at the angular frequency ω1. The number of pairs in the second and third IDTs 102 and 104 of the two-port SAW resonator is defined as M2=M3=0. In other words, it is analyzed how the higher-order vertical inharmonic modes are generated, with the two-port SAW resonator regarded as a one-port SAW resonator.

Here, the frequency increase is defined as Δf/f=(ω1−ωR)/ωR, with the angular frequency ωR of the first and second reflectors 101 and 105 used as a reference (See FIG. 3).

In FIG. 5, the hatched area shows a condition range in which the higher-order vertical inharmonic modes are generated. In other words, the curve 400 represents conditions by which a cutoff frequency for generation is given. Accordingly, by producing the two-port SAW resonator under conditions below the curve 400, the higher-order vertical inharmonic modes can be suppressed.

According to FIG. 5, as the number of pairs M1 in the first IDT 103 increases, a frequency increase range in which no higher-order vertical inharmonic mode is generated narrows. Therefore, as a practical range, a combination of ranges below the curve 400; the frequency increase Δf/f=2000 ppm to 12000 ppm; and the number of pairs M1=80 to 110 is preferable for suppressing spurious responses and reducing the equivalent series resistance R1.

In other words, by setting the frequency increase of the first IDT 103 in the range of 2000 ppm to 12000 ppm, or setting the number of pairs M1 in the first IDT 103 in the range of 80 to 110, spurious responses can be reduced, and the equivalent series resistance R1 of the two-port SAW resonator can be reduced.

The general tendency is that the smaller the number of pairs M1 are in the first IDT 103 and the smaller the frequency increase Δf/f is, the less are the higher-order vertical inharmonic modes.

Figure 6:
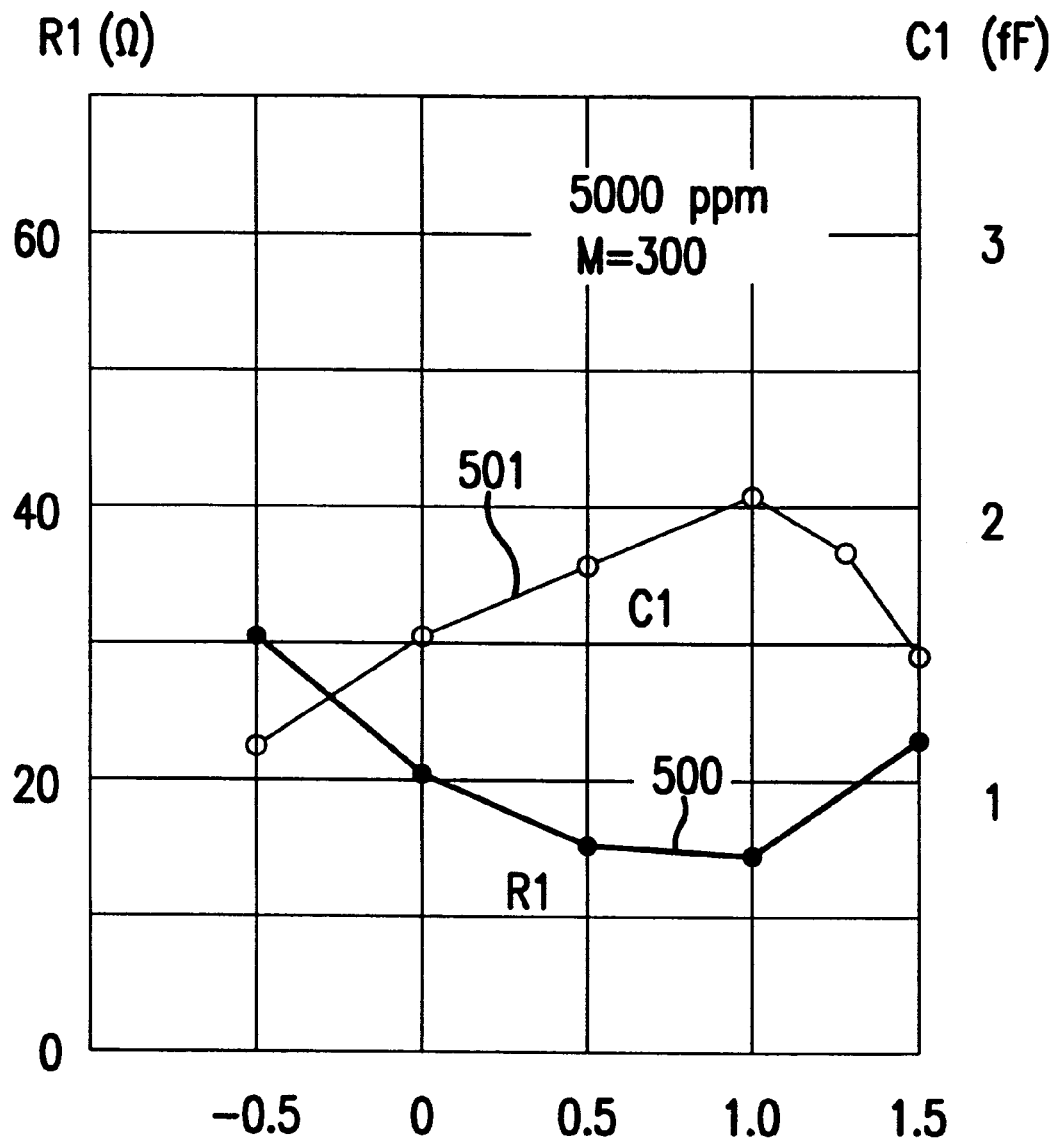
FIG. 6 is a graph showing the relationship between the frequency-increase rate of second and third IDTs and an equivalent series resistance in the two-port SAW resonator shown in FIG. 1.

FIG. 6 is a graph showing changes in the equivalent series resistance R1 (curve 500) and equivalent capacitance C1 (curve 501) of the two-port SAW resonator, obtained when the ratio (frequency-increase rate DF/DF1) between the frequency increase DF1 of the first IDT 103=(Δf/f)1 and the frequency increase DF of the second and third IDTs 102 and 104 is changed, with the frequency increase of the second IDT 103 fixed in the above-described range (the range from 2000 ppm to 12000 ppm).

As shown in FIG. 6, the minimum R1 is realized where the frequency-increase rate is approximately 1.0, and as the frequency-increase rate gets far from 1.0, C1 decreases. In particular, it is estimated that, as the frequency-increase rate decreases to be less than 1.0, the vibratory amplitude of the two-port SAW resonator tends to concentrate in the device center.

Film Thickness of IDT

Figure 7:
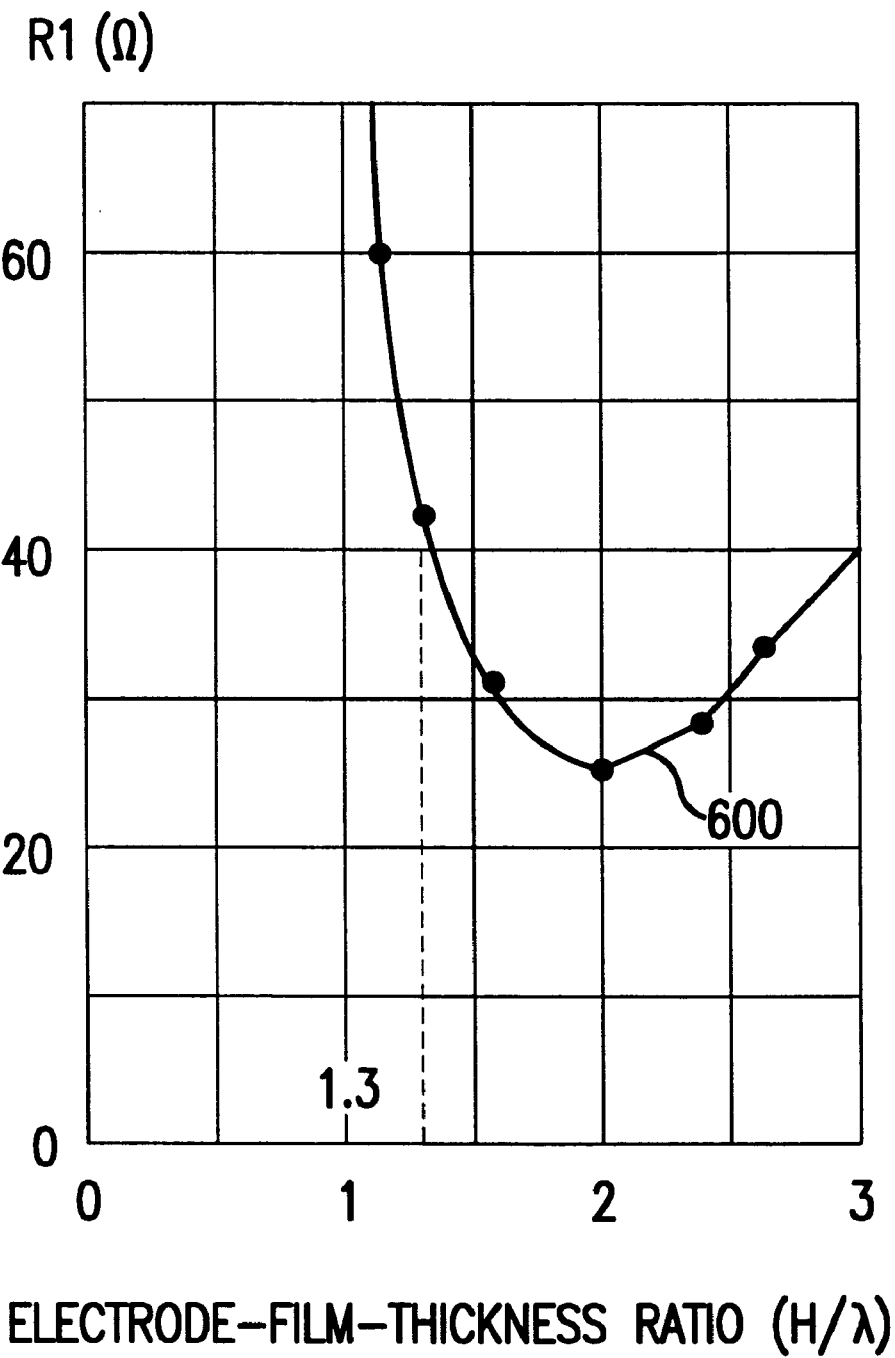
FIG. 7 is a graph showing the relationship between an electrode film thickness and an equivalent series resistance in the two-port SAW resonator shown in FIG. 1.

FIG. 7 is a graph showing the relationship between the ratio of the wavelength λ of surface acoustic waves with respect to the film thickness H of the aluminum electrodes constituting each IDT, and the equivalent series resistance R1. At this time, the frequency increase of the first IDT 103 is set at 5000 ppm, the sum of the numbers M1, M2 and M3 of pairs in the three IDTs is set at 300 pairs, the IDT divisor DIV is set at 4, and the frequency-increase rate is set at 0.0.

As shown in FIG. 7, the characteristic, curve 600 indicates that, in the range of H/λ=1.3% to 3%, R1 of 40Ω or less that can be used in an oscillating circuit without any problem being realized. In other words, by setting the ratio H/λ between the film thickness of the first to third IDTs 103, 102, and 104 and the wavelength λ of surface acoustic waves in the range of 0.013 to 0.03, the equivalent series resistance R1 can be reduced.

However, in the range where H/λ is 1.3% or less, resonant conditions cannot be established because the total reflection coefficient Γ decreases in all the IDT electrodes, and R1 rapidly increases. As a result, energy confinement cannot be established.

Accordingly, when the number of pairs in an IDT, the reflection coefficient of surface acoustic waves per strip conductor, the film thickness of the conductor, and the wavelength of surface acoustic waves, are represented by M, a, H, and λ, respectively, by assuming that a=0.255, H/λ=0.03, and M=80 in the case where the piezoelectric plate 100 is a conventional crystal plate with ST-cut quartz and X-transmission, and aluminum conductors are used for IDTs, Γ=approximately 2.448. By satisfying these conditions, a one-port SAW resonator having a sufficient performance, as shown in FIG. 3, can be formed. In addition, by dividing 80 pairs of electrodes on predetermined conditions, a two-port SAW resonator having a sufficient performance can be formed.

Transmission Characteristics

The transmission characteristics of the two-port SAW resonator obtained on the above-described conditions will be described using FIG. 8 to FIG. 11. FIG. 8 to FIG. 11 are graphs showing transmission characteristics obtained when the frequency-increase rate (DF/DF1) of the two-port SAW resonator shown in FIG. 1 is set at 1.5, 1.0, 0.0 and −0.5, respectively.

Figure 12:
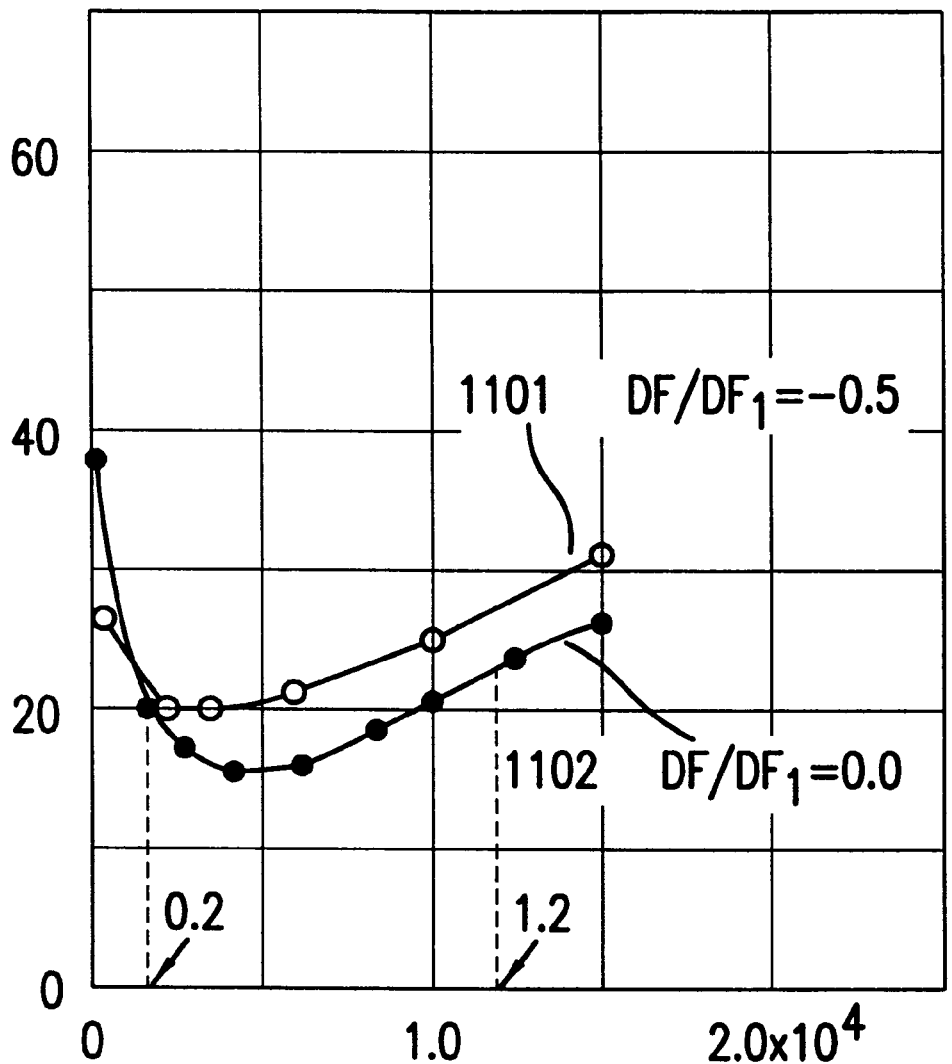
FIG. 12 is a graph showing the relationship between the frequency-increase rate of the first IDT and the equivalent series resistance in the two-port SAW resonator shown in FIG. 1.

FIG. 12 is a graph showing the relationship between the frequency increase of the first IDT 103 and the equivalent series resistance R1.

The transmission characteristics shown in FIG. 8 to FIG. 11 are the logarithms ($20 \cdot LOG_{10}(VOUT/VIN)$) of the ratio between an input voltage VIN to the device, which is generated by the AC signal source 107 in FIG. 1, and an output voltage VOUT from the device.

The output voltage is equal to the voltage across terminals of the load impedance ZL 106. Here, a resistance of 50Ω is used as the load impedance ZL 106. The constituent conditions of the two-port SAW resonator are set as follows: M=270, the number of reflector conductor strips is 174, H/λ=2.0%, IDT divisor DIV=2.75, the crossbus-bar width= 25.08 μm, the space width SP1=1.79 μm, and SP2=5.37 μm.

Figure 8:
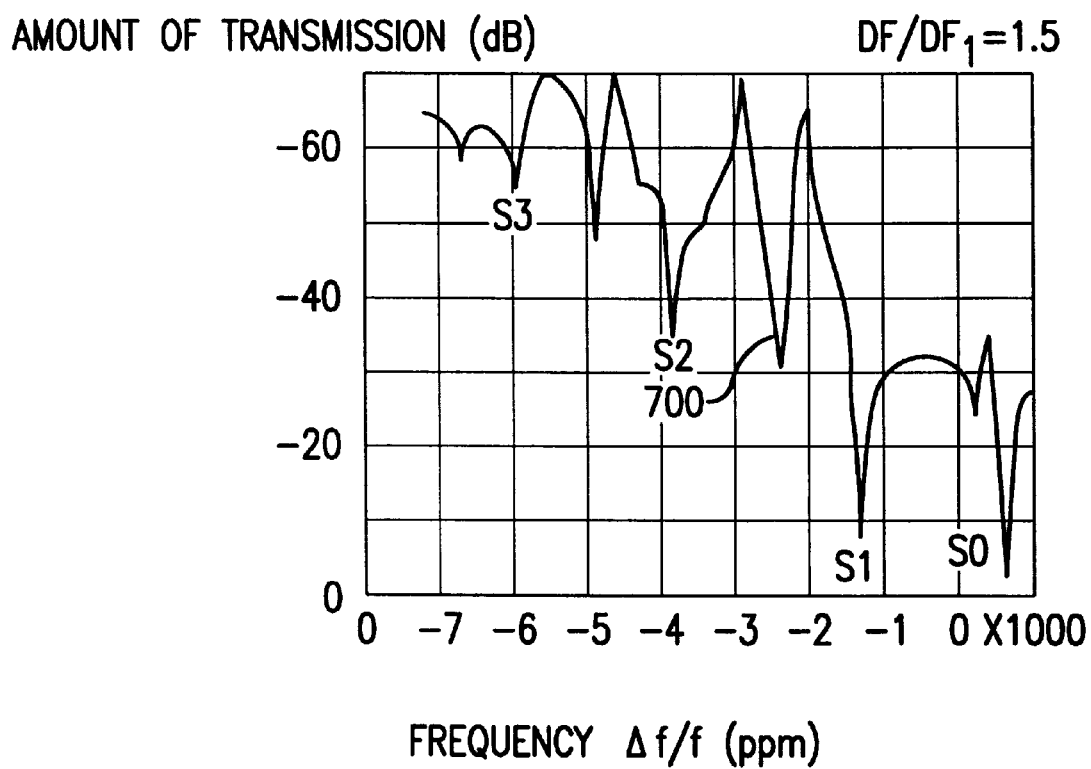
FIG. 8 is a graph showing the transmission characteristic obtained when the frequency-increase rate is set at 1.5 in the two-port SAW resonator shown in FIG. 1.

In FIG. 8, the transmission characteristic obtained when the frequency-increase rate DF/DF1=1.5 is represented by the curve 700. As shown in FIG. 8, there are a plurality of modes: symmetrical first-order (S1) to third-order (S3) other than the main resonant mode S0 as a basic vertical mode, and there is a spurious mode composed of a diagonally symmetrical higher-order vertical inharmonic mode between symmetrical modes. In this diagonally symmetrical mode, its vibratory displacement amplitude has a rotationally symmetrical displacement of 180 degrees with respect to the central origin in the X-axial direction (X-axis 120 in FIG. 1) of the two-port SAW resonator. Thus, it is found that, the higher the conductor pattern symmetry with the central origin, the less its resonant amplitude.

Figure 9:
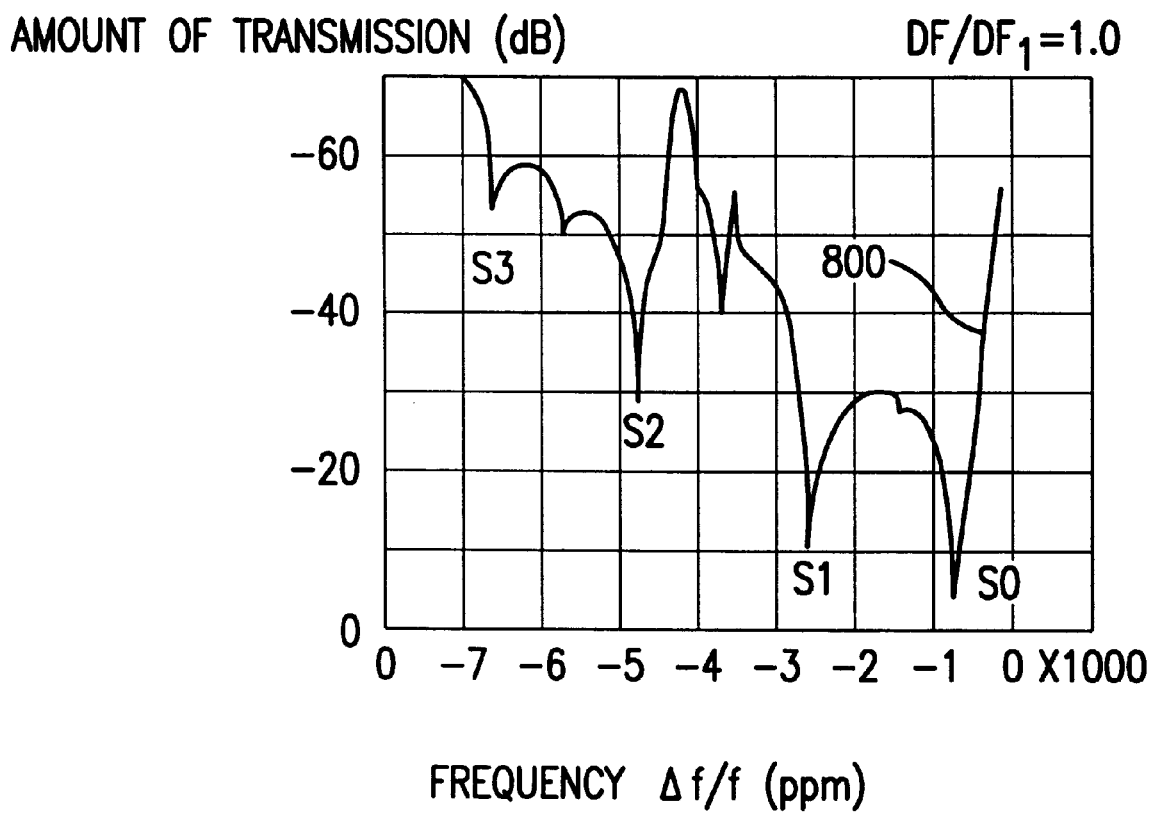
FIG. 9 is a graph showing the transmission characteristic obtained when the frequency-increase rate is set at 1.0 in the two-port SAW resonator shown in FIG. 1.

In FIG. 9, the transmission characteristic obtained when the frequency-increase rate DF/DF1=1.0 is represented by the curve 800. Basically, tendencies similar to those in FIG. 8 are shown.

Figure 10:
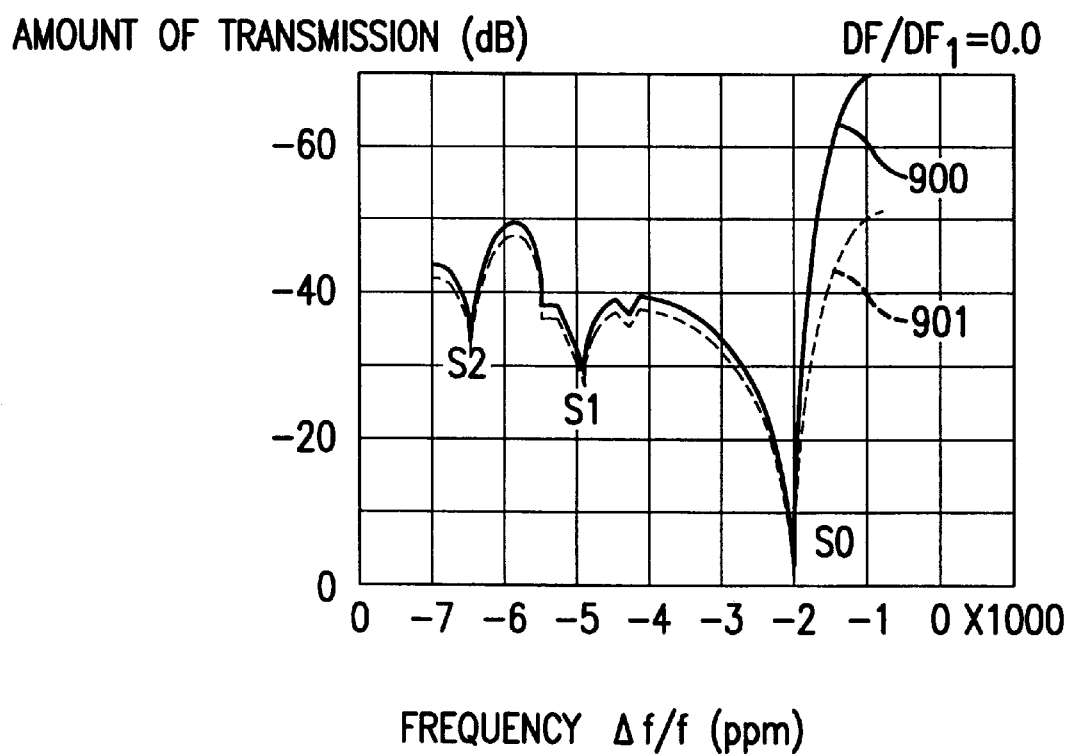
FIG. 10 is a graph showing the transmission characteristic obtained when the frequency-increase rate is set at 0.0 in the two-port SAW resonator shown in FIG. 1.

In FIG. 10, the transmission characteristic obtained when the frequency-increase rate DF/DF1=0.0 is represented by the curve 900. In FIG. 10, the curve 900 is a forward transmission characteristic (S21) in the condition shown in FIG. 1, and the curve 901 is a reverse transmission characteristic (S12) in the case where the signal source 107 and the load 106 (in FIG. 1) are exchanged.

By comparing the curves 900 and 901, it is seen that a slight shift occurs between them. Because this shift causes a small change in the resonant frequency, it is not preferable particularly in the case where a frequency precision of several ppm is required. This is because the parallel capacitances of input and output IDT electrodes are not equal.

Accordingly, as a result of studying measures, by setting the IDT divisor DIV at 4.0, coincident transmission characteristics were obtained. At this time, the number of pairs in the first IDT 103 was equal to the sum of pairs in the second IDT 102 and the third IDT 104, and when the divisor had a difference of 4±2%, in other words, the divisor was in the range of 4±0.08, no problem occurred in practice.

In the case in FIG. 10, spurious responses S1 and S2 are far from the main resonance S0, and attenuate.

Figure 11:
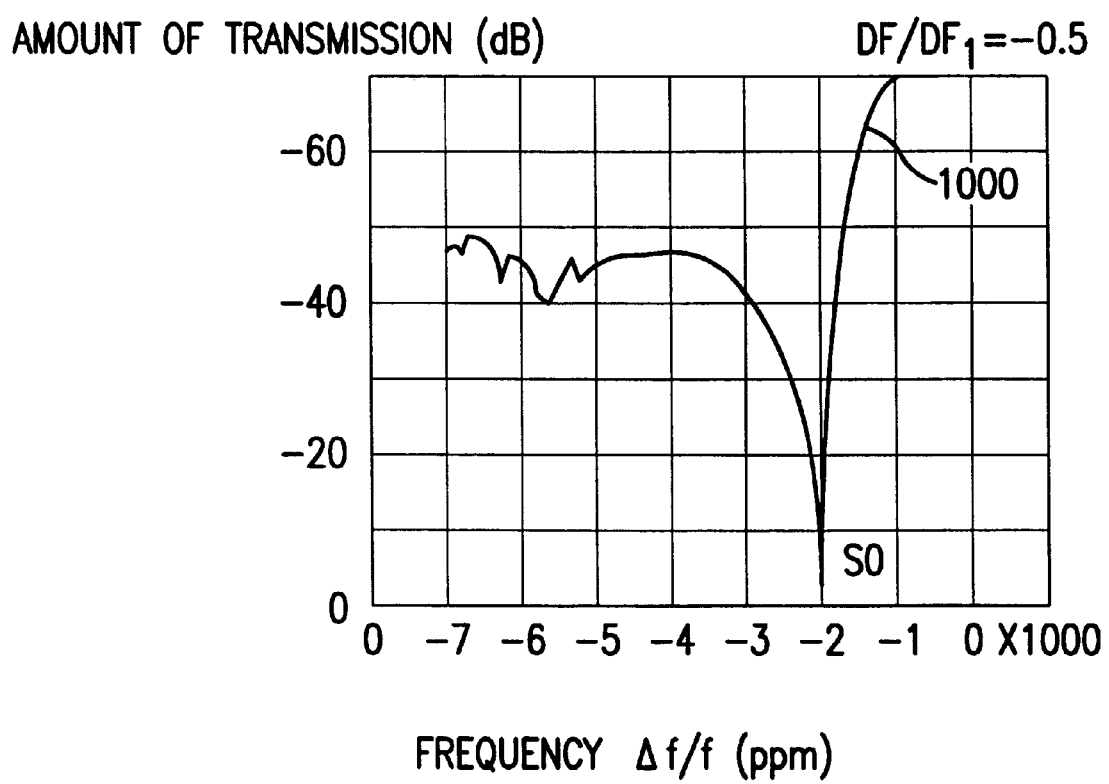
FIG. 11 is a graph showing the transmission characteristic obtained when the frequency-increase rate is set at −0.5 in the two-port SAW resonator shown in FIG. 1.

In FIG. 11, the transmission characteristic obtained when the frequency-increase rate DF/DF1=−0.5 is represented by the curve 1000. In this manner, when DF/DF1=−0.5 by reducing the IDT frequency-increase rate, spurious responses composed of the above-described high-order vertical modes completely disappear, and there is only the main resonance S0.

The optimal value of the frequency increase of the first IDT 103 will be described with reference to FIG. 12. In FIG. 12, the curve 1101 represents the relationship between the frequency increase of the IDT 1 and the equivalent series resistance R1 in the case where, with respect to the first IDT 103, the frequency-increase rate DF/DF1 of the second and third IDTs 102 and 104 is set at −0.5. Furthermore, FIG. 12 shows the relationship between the frequency increase of IDT 1 and the equivalent series resistance R1 by the curve 1102 when the frequency-increase rate DF/DF1 of the second and third IDTs 102 and 104 is defined as 0.0 with respect to the first IDT 103. At this time, the sum M of pairs in the IDTs=300, the ratio H/λ between the IDT film thickness H and the wavelength λ of surface acoustic waves=2.5%, and the IDT divisor DIV=4.0.

As shown in FIG. 12, when the frequency increase of the first IDT 103 is approximately 5000 ppm, there is the minimum value of the equivalent series resistance R1, and the frequency increase DF1 of the first IDT 103 is in the range of 2000 ppm to 12000 ppm, the equivalent series resistance R1 can be reduced to approximately 20Ω. In the range where the frequency increase DF1 of the first IDT 103 is 2000 ppm to 12000 ppm, particularly in the range of 4000 ppm to 10000 ppm, the equivalent series resistance R1 can be remarkably reduced.

From the foregoing results, it is concluded that the ST-X-cut quartz cannot simultaneously satisfy the aims that the equivalent series resistance R1 is small and that the spurious mode does not exist at all, which are required by the two-port SAW resonator. However, as a result of finding a compromise that can almost satisfy the two conditions, the following constituent conditions are given.

frequency increase DF1=4000 ppm to 10000 ppm frequency-increase rate DF/DF1 is approximately 0

IDT divisor is 4±2% (3.92 to 4.08)

H/λ is approximately 2 to 2.5%

Here, that frequency-increase rate DF/DF1 is approximately 0 means that, from DF=0, the strip conductor cycles PT2 and PT3 of the second and third IDTs 102 and 104 are almost equal to the strip conductor cycle PR of the first and second reflector 101 and 105.

In other words, $$\omega 2 = \omega 3 = \omega R \qquad (9)$$

$$PT2 = PT3 = PR \qquad (10)$$

Therefore, when the strip conductor cycles PT2 and PT3 of the second and third IDTs 102 and 104 are almost equal to the strip conductor cycle PR of the first and second reflector 101 and 105, in the two-port SAW resonator the equivalent series resistance R1 can be reduced and the spurious mode can be suppressed.

Structure of Crossbus-bar Conductor

Concerning a two-port SAW resonator in which crossbus-bar conductors are provided between a first IDT and a second IDT, and the first IDT and a third IDT, the relationship between the total length of the crossbus-bar conductor width and space widths on both sides thereof, and transmission characteristics, will be described with reference to FIG. 13 and FIG. 14.

Figure 13:
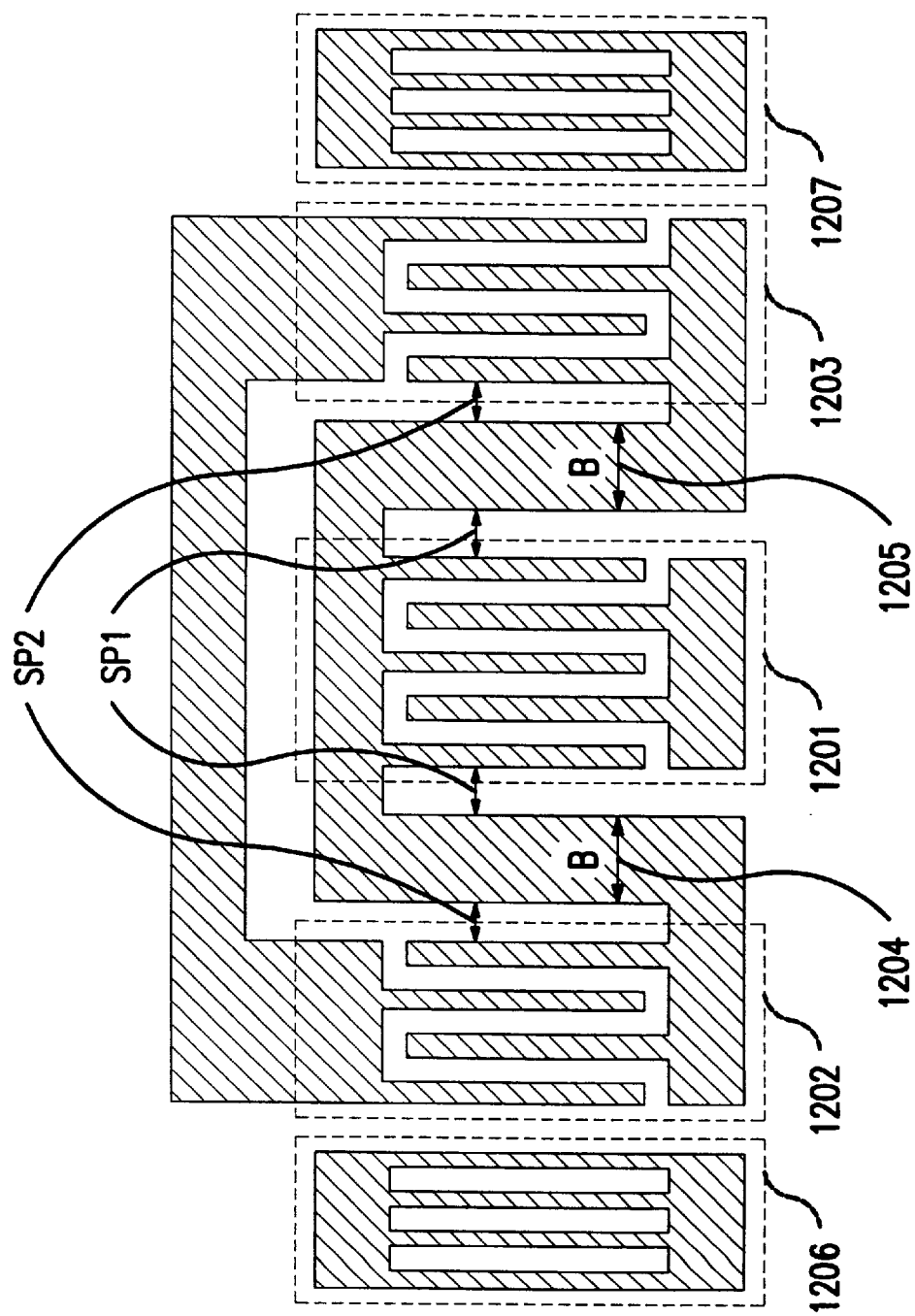
FIG. 13 is a plan vie w of a two-port SAW resonator according to another embodiment of the present invention.

FIG. 13 is a plan view of the electrode pattern of a two-port SAW resonator of the present invention in which the above-described crossbus-bar conductors are provided.

In the two-port SAW resonator shown in FIG. 13, parallel metal conductors cyclically formed on a piezoelectric plate (not shown) are used to form a first IDT 1201 for activating surface acoustic waves, and a pair of second and third IDTs 1202 and 1203 on both sides of the first IDT 1201 which receive the surface acoustic waves. Although many pairs of electrodes are formed in the first, second, and third IDTs 1201, 1202, and 103, only two pairs are shown in FIG. 13.

In this embodiment, there is provided a first crossbus-bar conductor 1204 between the first IDT 1201 and the second IDT 1202. There is provided a second crossbus-bar conductor 1205 between the first IDT 1201 and the third IDT 1203. The first IDT 1201 is used as the input terminal of the device, and the second and third IDTs 1202 and 1203 are output IDTs of the device. On both sides of the first, second, and third IDTs 1201, 1202, and 1203, a pair of first and second reflectors 1206 and 1207 is disposed. Since other basic arrangements are identical to those described with reference to FIG. 1, similar description is omitted.

Here, the crossbus-bar conductor widths of the crossbus-bar conductors 1204 and 1205 are represented by B, the widths of the spaces of the first IDT 1201 with the crossbus-bar conductors 1204 and 1205 are represented by SP1, and the widths of the spaces of the IDT 1202 or the IDT 1203 are represented by SP2.

Figure 14:
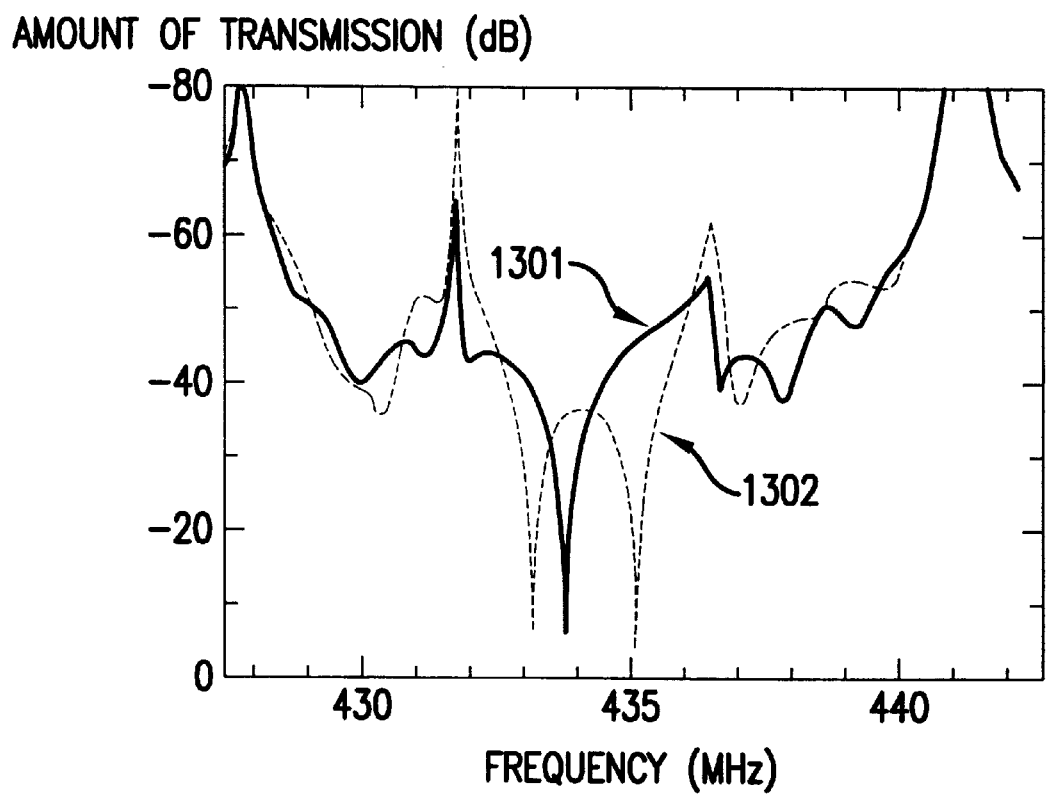
FIG. 14 is a graph showing the transmission characteristics of the two-port SAW resonator shown in FIG. 13.

Concerning the two-port SAW resonator having the above-described structure, the transmission characteristic obtained when size (B+SP1+SP2) is set at (n+1)λ, or nλ+(½)λ(n=0, 1, 2, . . . ) is represented by the curve 1302 in FIG. 14. As understood from the curve 1302, when size (B+SP1+SP2) is set at (n+1)λ, or nλ+(½)λ(n=0, 1, 2, . . . ), a waveform having two resonant frequencies is formed. This phenomenon of resonance is generated as two almost equivalent amplitudes, despite the fact that the above-described high-order inharmonic modes are completely suppressed.

As a result of optimizing size (B+SP1+SP2) in order to avoid the phenomenon that the two modes are activated, the transmission characteristic obtained when (B+SP1+SP2) is set at nλ+(¼)λ, or nλ+(¾)λ(n=0, 1, 2, . . . ), is represented by the curve 1301 in FIG. 14. As understood from the curve 1301, when (B+SP1+SP2) is set at nλ+(¼)λ, or nλ+(¾)λ (n=0, 1, 2, . . . ), a waveform having only one resonant mode is formed to avoid the phenomenon that the two resonant modes are activated.

Other Embodiments

In the case where a plate using another cut angle of quartz, or another type of piezoelectric material is used, by using the basic features of the present invention, and optimizing of condition-setting values, a preferable two-port SAW resonator can be formed. Also, in the case where other surface acoustic waves other than Rayleigh waves are used, by using the basic features and optimizing condition-setting values, a preferable two-port SAW resonator can be formed.

INDUSTRIAL APPLICABILITY

As described above, according to the present invention, in a two-port SAW resonator having a pair of reflectors and three IDTs, by setting the frequency increase of the second and third IDTs to be less than that of a first IDT so that a first frequency increase is set at 2000 ppm to 12000 ppm, and setting the number of pairs of electrodes in the second and third IDTs to be 2.75 to 3.75 or a quarter of the sum of pairs of electrodes on all the IDTs, spuricous responses caused by high-order vertical inharmonic mode can be suppressed.

In addition, by appropriately setting a crossbus-bar conductor and space widths on both sides thereof, another separate spurious mode can be suppressed to enable an equivalent series resistance of approximately 20Ω, whereby a two-port SAW resonator having a superior frequency stability in a high-frequency band of 500 MHz or higher can be provided to the market.

What is claimed is:

1. A two-port SAW resonator comprising:

a first interdigital transducer that activates surface acoustic waves;

one pair of a second interdigital transducer and a third interdigital transducer that receives the surface acoustic waves, one of the pair positioned on each side of said first interdigital transducer; and one pair of reflectors, one of the pair of reflectors positioned on one side of said second interdigital transducer and another of the pair of reflectors positioned on one side of said third interdigital transducer, said first interdigital transducer, said second interdigital transducer, and said third interdigital transducer being formed in pitches of lines and spaces of parallel metal conductors on a piezoelectric plate, the distance between two parallel conductors of the parallel metal conductors, obtained when said reflectors are closest with respect to said second interdigital transducer and said third interdigital transducer, being a space among the lines and the spaces of said second interdigital transducer and said third interdigital transducer, the pitch of parallel conductors of said first interdigital transducer being set to be smaller than the pitch of parallel conductors of said reflectors so that a frequency increase occurs, and a total reflection coefficient $\Gamma$ of said reflectors being set as $10 > \Gamma > 0.8$ so that energy confinement is established, and the pitch of parallel conductors of said second interdigital transducer and third interdigital transducer being set to be greater than the pitch of the parallel conductors of said first interdigital transducer so that frequency decreasing occurs.

2. The two-port SAW resonator according to claim 1, a number of pairs of said second interdigital transducer and said third interdigital transducer being in a range of 1/2.75 to 1/3.75 of a sum of numbers of pairs in said first interdigital transducer, said second interdigital transducer, and said third interdigital transducer.

3. The two-port SAW resonator according to claim 1, a number of pairs of said second interdigital transducer and said third interdigital transducer being in a range of 1/3.92 to 1/4.08 of a sum of numbers of pairs in said first interdigital transducer, said second interdigital transducer, and said third interdigital transducer.

4. The two-port SAW resonator according to claim 1, the frequency increase of said first interdigital transducer being in a range of 2000 ppm to 12000 ppm.

5. The two-port SAW resonator according to claim 1, the frequency increase of said first interdigital transducer being in a range of 4000 ppm to 10000 ppm.

6. The two-port SAW resonator according to claim 1, a number of pairs of said first interdigital transducer being in a range from 80 to 110.

7. The two-port SAW resonator according to claim 1, the cycle of the parallel conductors of said second interdigital transducer and said third interdigital transducer being approximately equal to that of said reflectors.

8. The two-port SAW resonator according to claim 1, an electrode-film thickness of said first interdigital transducer being less than a film thickness of said second interdigital transducer and said third interdigital transducer.

9. The two-port SAW resonator according to claim 1, when the film thickness of said first interdigital transducer, said second interdigital transducer, and said third interdigital transducer is represented by H, and a wavelength of said surface acoustic waves is represented by $\lambda$ a ratio $H/\lambda$ between the film thickness H of said interdigital transducer, said second interdigital transducer, and said third interdigital transducer and the wavelength $\lambda$ of said surface acoustic waves being in a range of 0.013 to 0.03.

10. A two-port SAW resonator according to claim 1, a sum of a number of pairs in said first interdigital transducer, said second interdigital transducer, and said third interdigital transducer being in a range of 180 to 300.

11. The two-port SAW resonator according to claim 1, a total length of widths of crossbus-bar conductors formed between said first interdigital transducer and said second interdigital transducer and between said first interdigital transducer and said third interdigital transducer, and widths of spaces on both sides of the widths of said crossbus-bar conductors, being $n\lambda+(\frac{1}{4})\lambda$, or $n\lambda+(\frac{3}{4})\lambda$ ($n=0, 1, 2, \ldots$) where $\lambda$ is the wavelength of said surface acoustic waves.

12. The two-port SAW resonator according to claim 1, said piezoelectric plate being ST-cut or K-cut quartz.

* * * * *